United States Patent [19]
Fricke et al.

[11] Patent Number: 6,134,957
[45] Date of Patent: *Oct. 24, 2000

[54] MULTIPLE DEGREE-OF-FREEDOM TIRE MODELING METHOD AND SYSTEM FOR USE WITH A VEHICLE SPINDLE-COUPLED SIMULATOR

[75] Inventors: David M. Fricke, Howell; Rakan Chabaan, Farmington Hills, both of Mich.

[73] Assignee: Ford Global Technologies, Inc., Dearborn, Ill.

[ * ] Notice: This patent is subject to a terminal disclaimer.

[21] Appl. No.: 08/895,491

[22] Filed: Jul. 16, 1997

[51] Int. Cl.$^7$ .................................................. G01M 17/04
[52] U.S. Cl. ............................................ 73/146; 73/865.6
[58] Field of Search .................................. 73/8, 117, 146, 73/146.2, 146.3, 146.4, 146.5, 865.6, 669

[56] References Cited

U.S. PATENT DOCUMENTS

| | | |
|---|---|---|
| 3,520,180 | 7/1970 | Polhemus et al. . |
| 3,713,330 | 1/1973 | Lentz . |
| 3,718,033 | 2/1973 | Petersen . |
| 4,981,034 | 1/1991 | Haeg . |
| 4,986,119 | 1/1991 | Gicewicz ................................. 73/146 |
| 5,003,819 | 4/1991 | Koopmann . |
| 5,065,618 | 11/1991 | Hodges, Sr. et al. . |
| 5,088,321 | 2/1992 | Kajikawa et al. ........................ 73/146 |
| 5,092,166 | 3/1992 | Wada et al. ............................... 73/146 |
| 5,259,246 | 11/1993 | Stuyts . |
| 5,610,330 | 3/1997 | Fricke et al. . |
| 5,750,890 | 5/1998 | Fricke et al. ............................. 73/146 |
| 5,880,362 | 3/1999 | Tang et al. ............................... 73/146 |
| 5,900,542 | 5/1999 | Fricke et al. ............................. 73/146 |

OTHER PUBLICATIONS

"A Technique for Measuring 'Effective' Road Profiles" (Allan P. Whittemore) SAE Paper 720094, Undated.
"Making A Road Simulator Simulate" (Ronald A. Cripe) SAE Paper 720095, Undated.

*Primary Examiner*—George Dombroske
*Attorney, Agent, or Firm*—David B. Kelley

[57] ABSTRACT

A method for developing a tire model for use with an effective road profile in testing an automotive vehicle on a spindle-coupled road simulator defines a flat surface road plane in a multiple coordinate reference system to represent the effective road profile. The coordinates comprise at least four of a plane vertical deflection, a plane radial contact angle, a plane lateral contact angle, a steer contact angle, a lateral displacement and a longitudinal displacement. A tire is excited over a predetermined range while on a tire test apparatus for developing the tire model. The tire test apparatus includes an articulated running flat belt platform moveable so as to contact the tire, the flat tire contact plane defining a coordinate reference system to represent the effective road profile in multiple degrees-of-freedom.

16 Claims, 8 Drawing Sheets

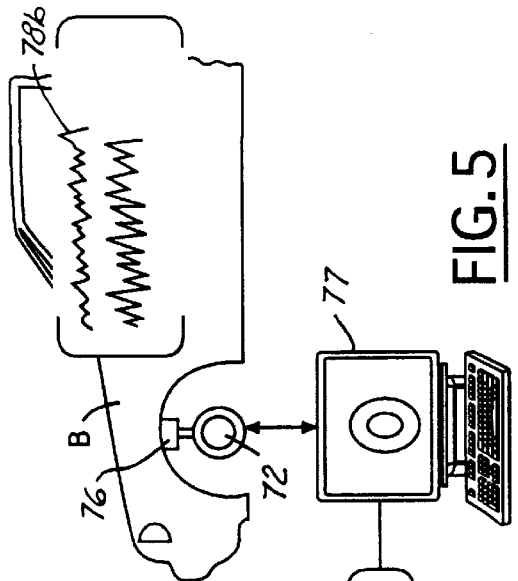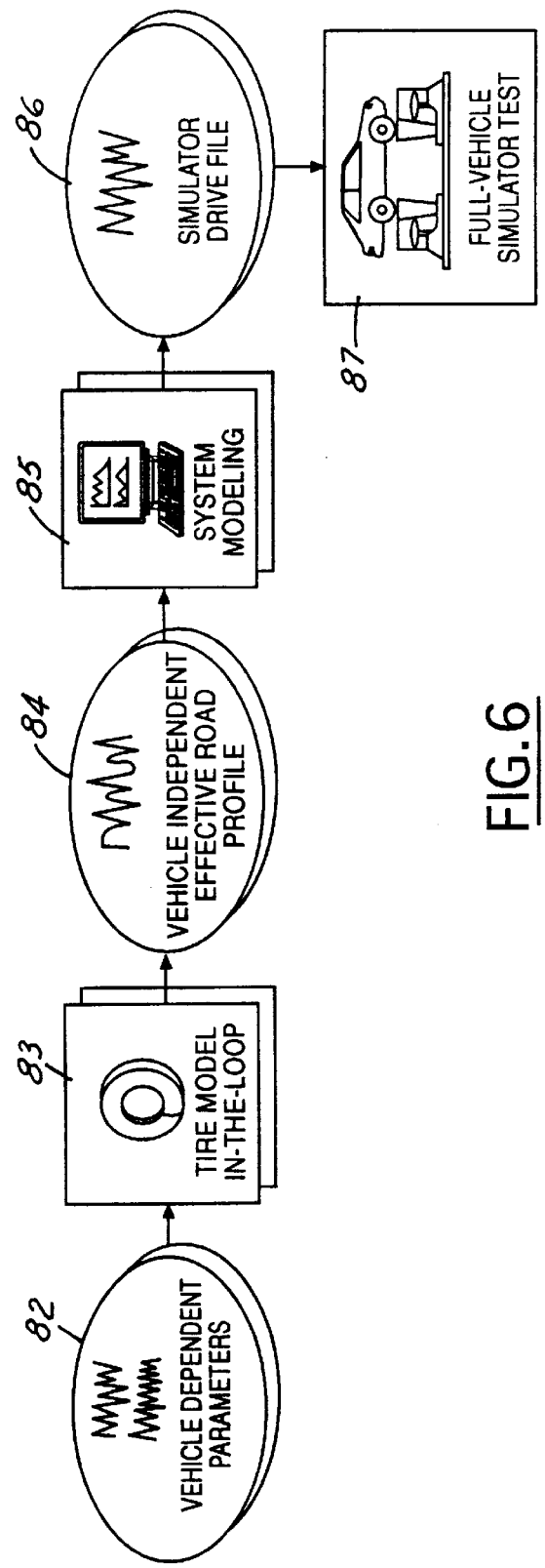
FIG. 5
FIG. 6

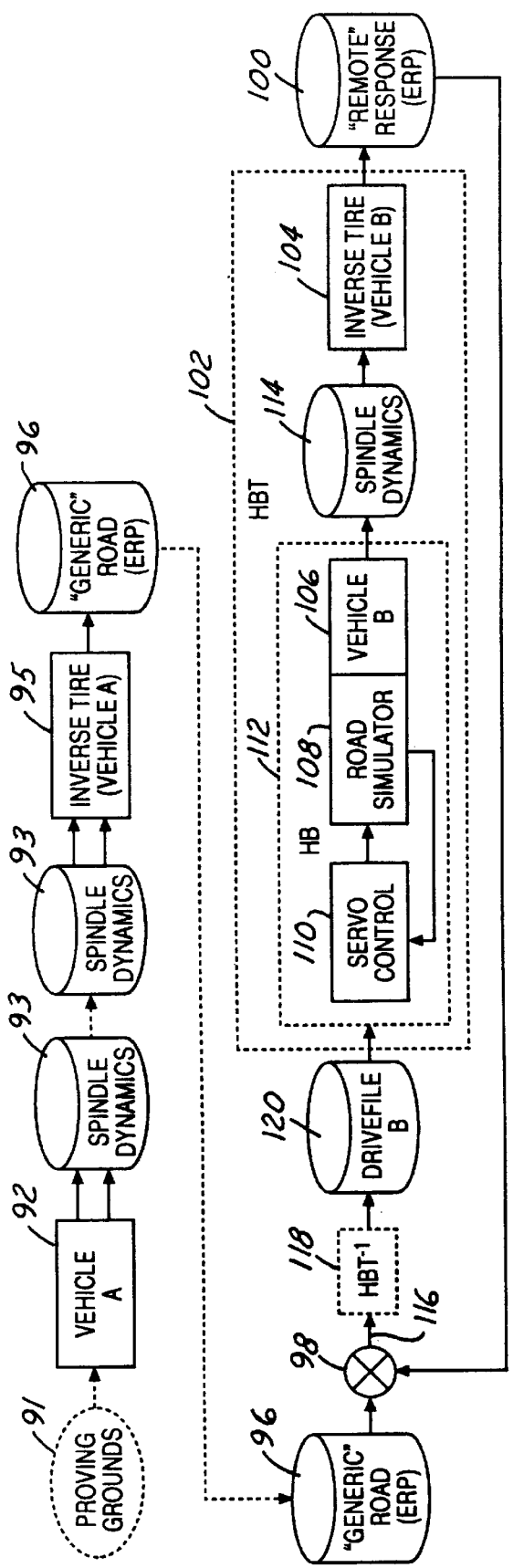
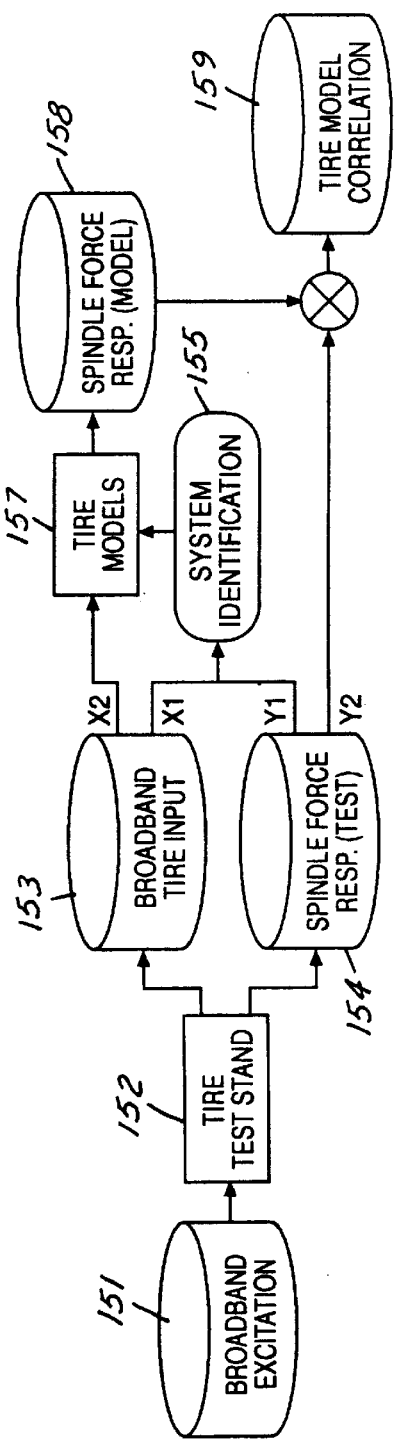
FIG. 7
FIG. 13

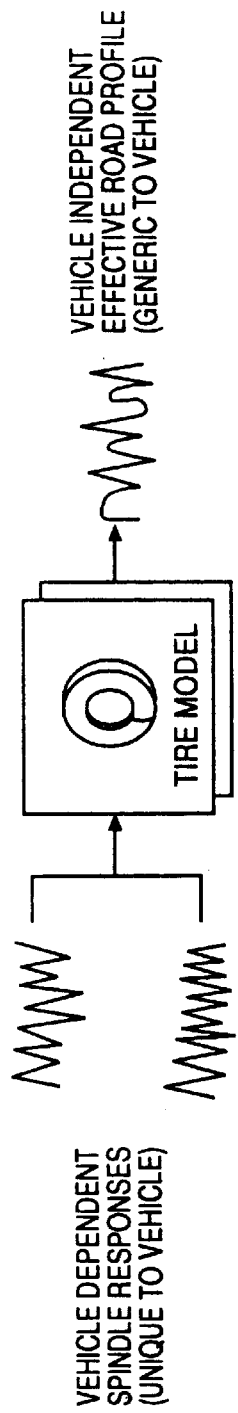
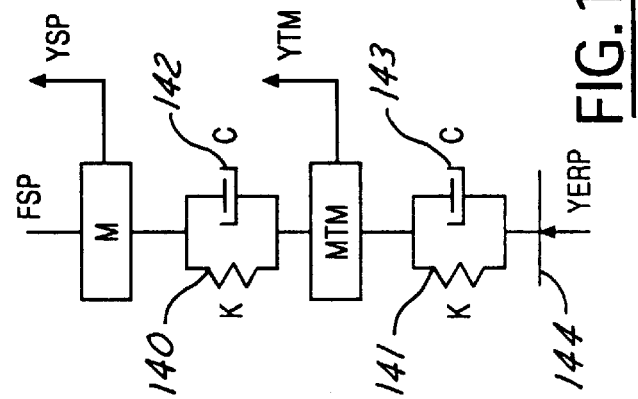
FIG. 12
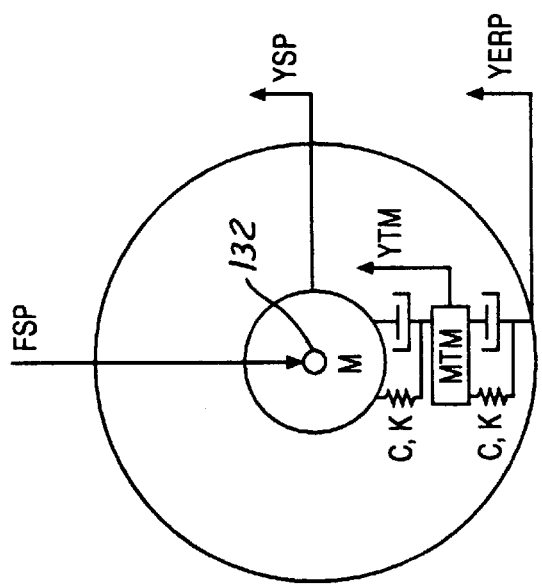
FIG. 11
FIG. 8

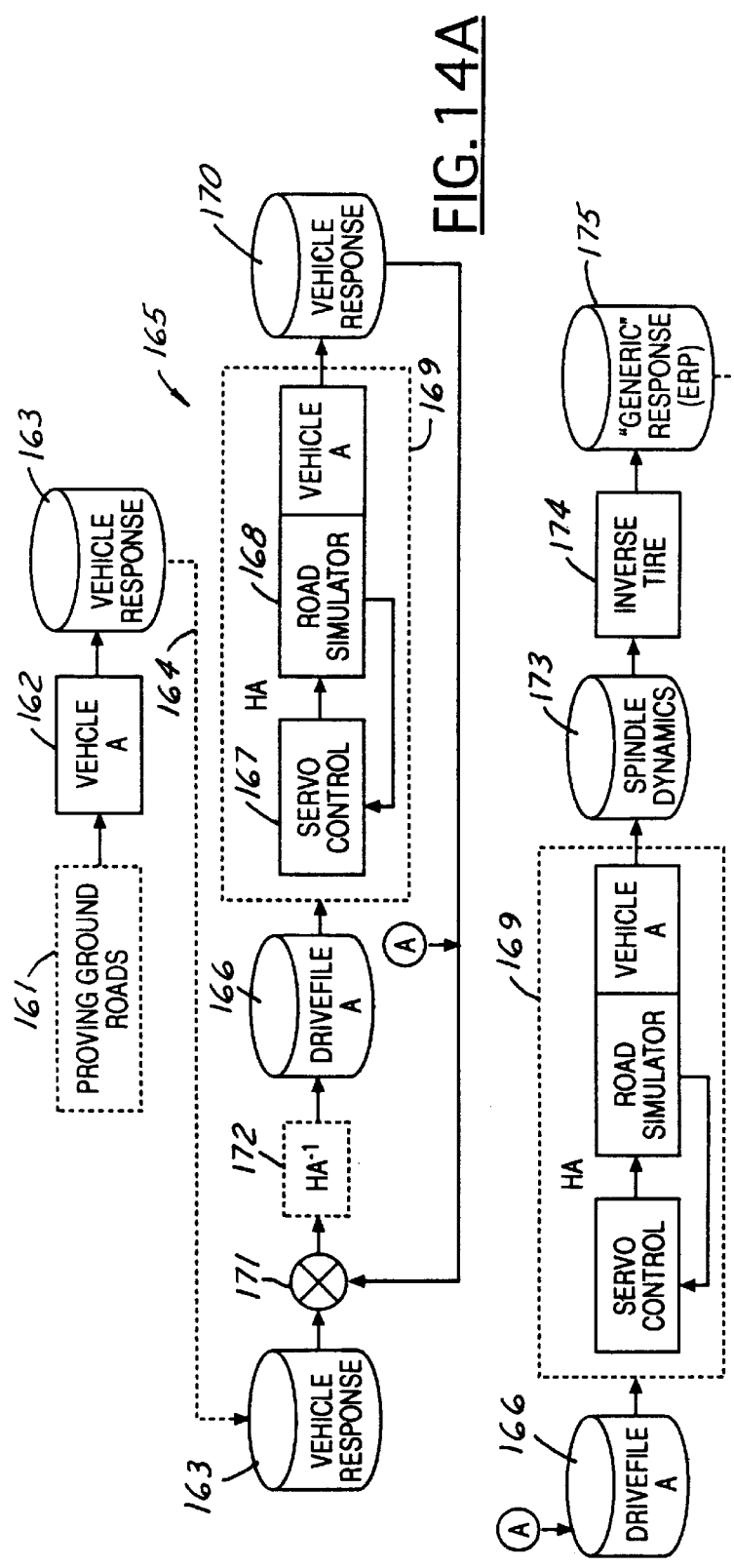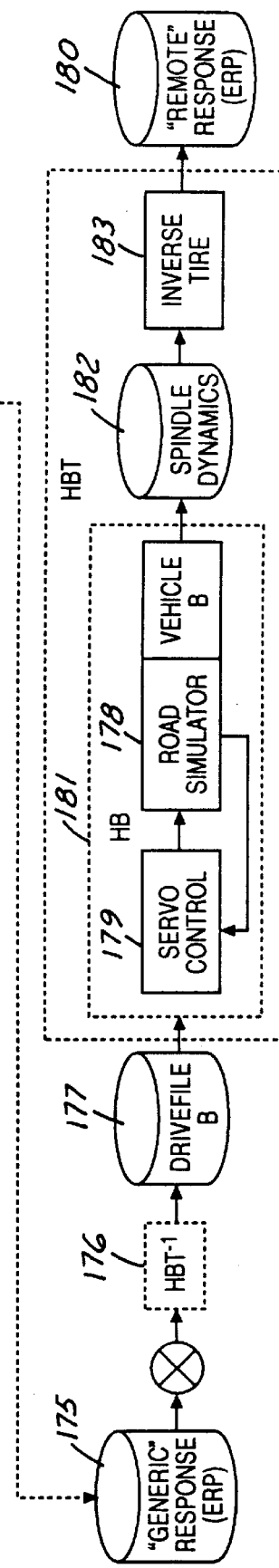
FIG. 14A
FIG. 14B

MULTIPLE DEGREE-OF-FREEDOM TIRE MODELING METHOD AND SYSTEM FOR USE WITH A VEHICLE SPINDLE-COUPLED SIMULATOR

FIELD OF THE INVENTION

The present invention relates to tire models for automotive vehicle simulators, and particularly for spindle-coupled vehicle simulators.

BACKGROUND OF THE INVENTION

The use of large-deflection tire models to predict vehicle loads for design or simulation testing has become an important application in the automotive vehicle development process. A wide range of tire models have been used to simulate the tire. In general, current tire models can be divided into three categories: simple models, ring elastic foundation (REF) models, and detailed models.

Two simple tire models are shown in FIGS. 1 and 2. These models assume that the tire envelopes an obstacle and that the effect the tire tread has on contact and deformation is negligible. In a radial spring model (FIG. 1), the tire envelopes the terrain with springs that are radially attached to center of the tire. Another simple model, commonly referred to as an ADAMS model (FIG. 3), uses an "equivalent ground plane" to calculate the longitudinal and vertical spindle forces. In both models, the net spindle force is generated by summing the individual spring forces in the vertical and horizontal directions.

In contrast to simple models, a Ring Elastic Foundation (REF) model represents the tire as an elastic foundation supporting a tread. REF models can be represented either with partial differential equations or with finite elements. Detailed tire models are three dimensional finite element representations of the complete tire (FIG. 4). These models are more representative of an actual tire than the previously discussed models, but a major disadvantage of this type of model is the large number of degrees-of-freedom needed and consequently the intensive computing time required.

Many existing tire models use a finite element analysis (FEA) approach to determine vehicle loads. However, these currently available models have inaccurately estimated tire loads through computer simulation. In addition, all of the tire finite-element models discussed above are time-intensive to build and run. Vehicle spindle-coupled simulation requires a tire model that is relatively easy to model from readily-measurable parameters, which is not computationally intensive, and which is easy to implement with a spindle-coupled simulation controller utilizing an effective road profile.

A tire model to meet the just described requirements was disclosed in U.S. patent application Ser. No. 08/585,675, now U.S. Pat. No. 5,750,890, assigned to the assignee of the present invention and incorporated herein by reference. In that application, a method and apparatus for acquiring input and output data was disclosed, as was a coordinate system for defining an effective road profile. The coordinate system, defined three-dimensionally, was selected to represent a 'flat surface road plane' with a plane vertical deflection at the tire patch center, a plane radial contact angle with the tire, and a plane lateral contact angle with the tire. However, a more accurate tire model is desirable to further identify tire dynamics.

SUMMARY OF THE INVENTION

The present invention provides an advance in tire modeling for use with a spindle-coupled simulator by defining a six degree-of-freedom coordinate system for use with an effective road profile. An articulated running flat belt platform is used to define a coordinate system with six coordinates: a plane vertical deflection at the tire patch center, a plane radial contact angle with the, a plane lateral contact angle with the tire, a steer contact angle between the tire and the tire patch, a lateral displacement of the tire with the tire patch, and a longitudinal displacement of the tire with respect to the tire patch. Loads which affect the structural durability of vehicles can thus be accurately reproduced by achieving the correct force, moment, and acceleration relationships at the spindle which are consistent with the desired road load inputs of a tire. Experimental data for use with the tire model system identification technique is therefore obtained in the form of spindle force, moment, and acceleration, and spindle force-moment, collectively the outputs, as well as the input rolling tire plane deflections.

A tire test stand capable of producing the required input and collecting the desired output with reference to the flat surface road plane coordinate system is also necessary. The six axis tire test stand generates random flat surface radial deflections and six axis contact angles with a test tire mounted thereon. After the deflection input and spindle load output data is generated, it is used to develop a radial tire model using the system identification technique.

Thus, an advantage of the present invention is a method for modeling a vehicle tire for use with a spindle-coupled simulator which is relatively easy to model from readily-measurable parameters, which is not computationally intensive, and which is easy to implement with a spindle-coupled simulation controller utilizing an effective road profile.

Another advantage is a tire test stand which is capable of providing test inputs to a vehicle tire and generating test outputs in a flat surface road plane coordinate system required for to develop a tire model for use with an effective road profile.

BRIEF DESCRIPTION OF THE DRAWINGS

These and other objects, advantages, and features of the present invention will be apparent to those skilled in the vehicle testing arts upon reading the following description with reference to the accompanying drawings, in which:

FIG. 5 shows an effective road profile for use in combination with a tire model to eliminate sample road testing of a vehicle to be tested on a spindle-coupled simulator;

FIG. 6 is a schematic flow diagram of the effective road profile control method for use with a spindle-coupled road simulator;

FIG. 7 is a schematic flow diagram of an effective road profile control method for a spindle-coupled simulator according the present invention;

FIG. 8 shows development of an effective road profile generic to a vehicle from a set of unique vehicle dependent responses and a tire model;

FIGS. 11 and 12 show, respectively, a tire freebody force and parameter model and a tire model diagram;

FIG. 13 is a first schematic flow diagram showing development of a tire model through use of a system identification technique for use with an effective road profile control method;

FIGS. 14A and 14B are a second schematic flow diagram showing a second effective road profile control method for a spindle-coupled road simulator.

DETAILED DESCRIPTION OF THE PREFERRED EMBODIMENTS

Figure 1:
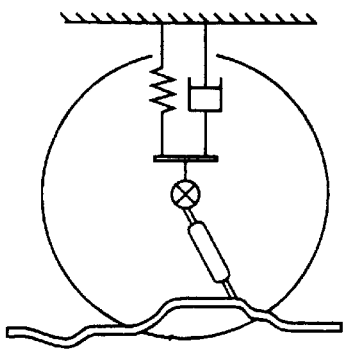
FIG. 1 shows a prior art simple tire model.
Figure 2:
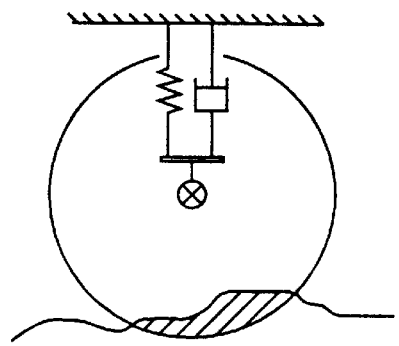
FIG. 2 shows a second prior art simple tire model.
Figure 3:
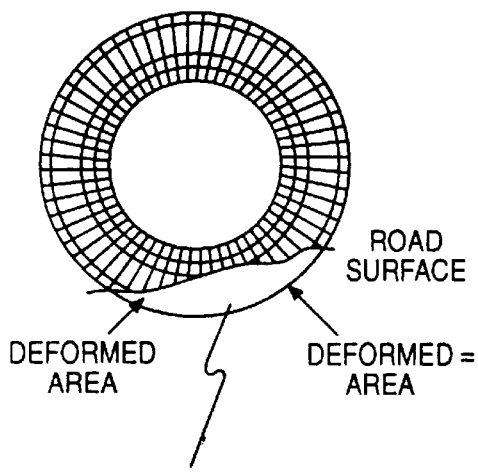
FIG. 3 shows a third prior art simple tire model, referred to as an ADAMS model.
Figure 3:
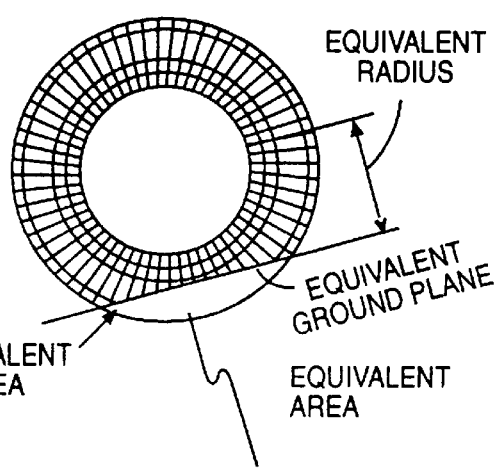
Figure 4:
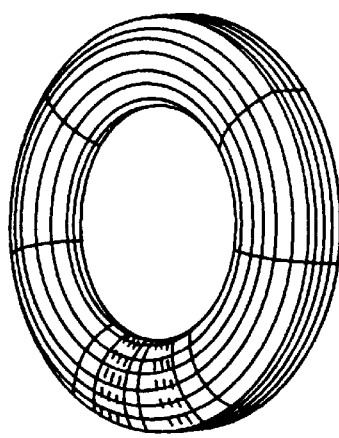
FIG. 4 shows a finite element representation of a tire for use with a finite element tire model.

Referring now to the drawings and in particular to FIG. 5 thereof, a vehicle A has a suspension configuration which includes a spring 70 above a spindle 72. A spindle force history 73a and spindle acceleration history 73b are generated when vehicle A is driven over a test road, such as is typically available at a vehicle proving grounds. The spindle force and acceleration histories 73a, 73b are used in conjunction with a model 74 of a tire attached to vehicle A when driven over the test road to develop an effective road profile 75. For purposes of this disclosure, an effective road profile is a set of signals which, in conjunction with a tire model, and when used as a feedback parameter in a standard response simulation test process, provides accurate excitation of the spindle-coupled simulator to simulate a test road. A vehicle B, having a different configuration, for example an air suspension 76, can be accurately tested without the need for driving the vehicle B over a test road. That test is accomplished by using the effective road profile 75 and a second tire model 77, which represents a tire used on the vehicle B, to generate a spindle force history 78 which would be developed had vehicle B been driven over the test road with a tire model 77. Thus, only one vehicle configuration need be driven over a test road to obtain the data necessary to develop an effective road profile which can subsequently be used for testing other vehicle configurations.

A schematic flow diagram of the just described process is seen in FIG. 6. In ellipse 82, vehicle dependent parameters, such as spindle force and spindle acceleration, are obtained for a first, or test, vehicle when driven over a test road. The vehicle dependent parameters are then used in conjunction with a tire model 83 to yield a vehicle independent effective road profile 84. Since the effective road profile is independent, that is, it is representative of the actual test road without regard to vehicle configuration or tire model, it may be used with a model of a spindle-coupled simulator 85 in a feedback control process to develop a simulator drive file 86 which can be used as an input to a spindle-coupled simulator 87 with a second vehicle coupled thereto. It is important to note that the second vehicle need not have been driven over the test road.

Turning now to FIG. 7, a more detailed flow diagram of a preferred embodiment of the effective road profile control method for a spindle-coupled simulator of the present invention is shown. Beginning at the top left of FIG. 7, a proving grounds facility 91 has a test road over which a vehicle A, indicated by box 92, is driven. Spindle dynamics data from the vehicle A is collected and is represented at cylinder 93, the data including spindle force and spindle acceleration as previously discussed. Typically, a vehicle has four spindles and spindle dynamics data is collected from each spindle. The data may be collected using force and acceleration transducers, or from other data collection devices known to those skilled in the art.

The collected dynamics data is then taken to a test facility or laboratory, as indicated by the dotted line 94, where it is used in conjunction with an inverse of a tire model, indicated at 95, to estimate a generic effective road profile, indicated at 96. The inverse tire model 95 is based upon a tire model of a tire used on vehicle A when driven over the test road. Those skilled in the art will recognize that the steps previously described are accomplished for each spindle and tire of the vehicle A, and that a single tire model for vehicle A may be used for each spindle.

The tire model, discussed in more detail below, can be represented as a transfer function developed from a set of linear differential equations which represent a physical tire. The model must be invertible, that is, have an inverse as that term is known by those skilled in the systems dynamics and control arts. The inverse of the tire model is needed for use with the spindle dynamics data since it is the tire input which must be predicted, although the tire model was developed to produce the spindle response to a known input.

Still referring to FIG. 7, the effective road profile 96 is used in a feedback control loop as indicated by line 97. The feedback control loop includes a summer 98 at which signals from the effective road profile 96 are compared to an output, referred to as 'remote' response and indicated generally at 100. The remote response 100 is an output from a spindle-coupled road simulator transfer function HBT, indicated generally at 102, which includes an inverse of a tire model 104 of a tire on a second, or sample, vehicle B, indicated at 106. Development of the tire model for a tire of vehicle B is accomplished similarly to that for the tire of vehicle A, as described below. It should be understood that development of the tire models, both for vehicle A and vehicle B, need not be done at any particular time or in any particular order but only that such models be available when required by other steps of the method of the present invention.

Vehicle B, which has a different configuration than that of vehicle A as described above with reference to FIG. 5, is coupled to a spindle-coupled road simulator 108. A servo-controller 110, such an a conventional servo-control apparatus, is used for control of the road simulator (FIG. 7). System modeling of the vehicle B, the road simulator 108, and the servo-control 110, collectively comprise a transfer function HB, indicated generally at 112. Spindle dynamics data for vehicle B, indicated at cylinder 114, are generated from the road simulator 108 with vehicle B attached thereto. The spindle dynamics data 114 is then used in conjunction with the inverse tire model 104 for vehicle B to yield the remote response 100. The transfer function HB, the spindle dynamics 114, and the inverse tire model 104 collectively comprise the transfer function HBT.

As previously discussed, a difference between the generic effective road profile 96 and the remote response 100 is calculated at 116 and is operated on by an inverse transfer function $HBT^{-1}$, indicated generally at 118, before being written to a drive file B indicated generally at cylinder 120. The set of control signals thus generated in the drive file B represents a unique control input for a particular simulatorvehicle-controller combination. The vehicle B can then be further tested while coupled to the spindle-coupled simulator without the need for driving it over the test road.

Turning now to FIG. 8, it is seen that a tire model transforms vehicle dependent spindle responses, which are unique to a particular vehicle, into an effective road profile, which is vehicle independent. Various tire models could be used to simulate the tire providing that the particular model used has an inverse. Simple tire models typically assume that the tire envelopes an obstacle and the effect the tire tread has on contact and deformation is negligible. A net spindle force is generated by summing individual spring forces in the vertical and horizontal direction. For example, a radial spring model envelopes the terrain with springs that are radially attached to the center of a tire.

Ring elastic foundation models represent the tire as an the elastic foundation supporting a tread. These models are represented either with partial differential equations or with finite elements. This model requires fewer degrees-of-freedom than other finite element models to produce accurate results.

Detailed tire models are three dimensional finite element representations of a complete tire. These models are more representative of an actual tire and therefore, predict loads more accurately.

Regardless of the level of detail, all of the finite-element model forms discussed above are time-intensive to build and run and require an understanding of the tire material properties. If such requirements are met, the previously discussed models must be invertible, or so constructed to provide the requisite bridge between vehicle dependent spindle responses and an effective road profile. Preferably, however, a tire model which is easily derivable from readily measurable parameters, and which is easily implemented with the spindle-coupled simulator controller is desirable.

To develop such a tire model, system identification methods are preferably used to identify dynamic properties of a vehicle tire to be modeled. The system identification modeling approach requires experimental input/output test data which allows the dynamics of a system to be observed, and aids in the selection of an appropriate model form. Alternatively, a model form can be assumed, based upon an understanding of the known physical characteristics of the system. Once a model form for the system is selected, the model parameters (e.g., coefficients of the selected differential equations) can be identified based upon a system identification method (such as least squares estimation) that minimizes the output error between the physical system and modeled system for a given input.

Another option is to use a frequency response function model to represent the tire dynamics. This option, however, does not allow any physical properties of the tire to be assigned.

Figure 9A:
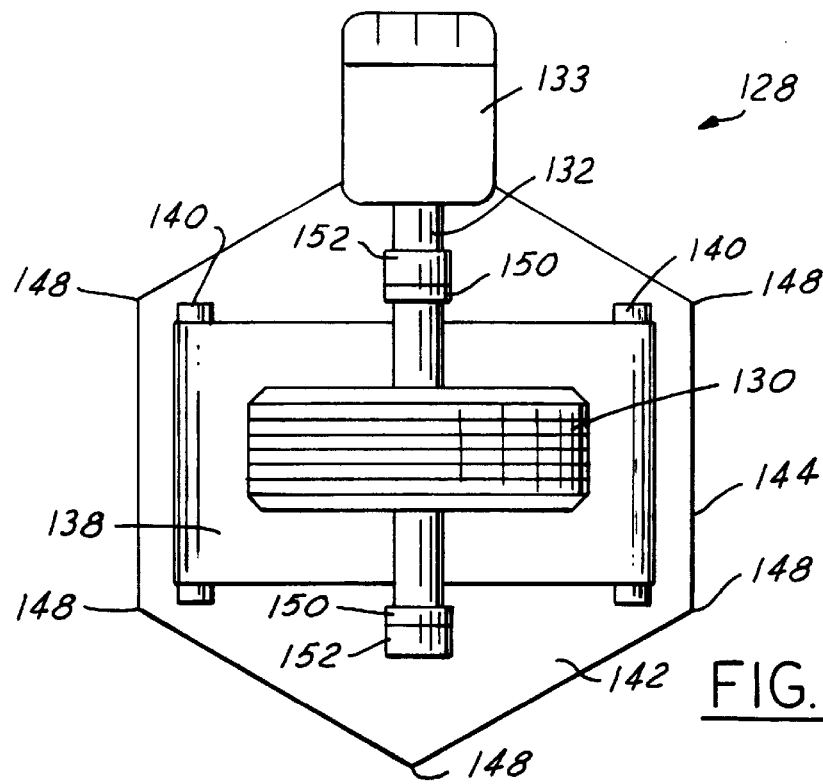
FIGS. 9A and 9B show, respectively, a top view and a side view of a tire test stand according to the present invention for development of a tire model with six degrees-of-freedom for use in spindle-coupled road simulator.
Figure 9B:
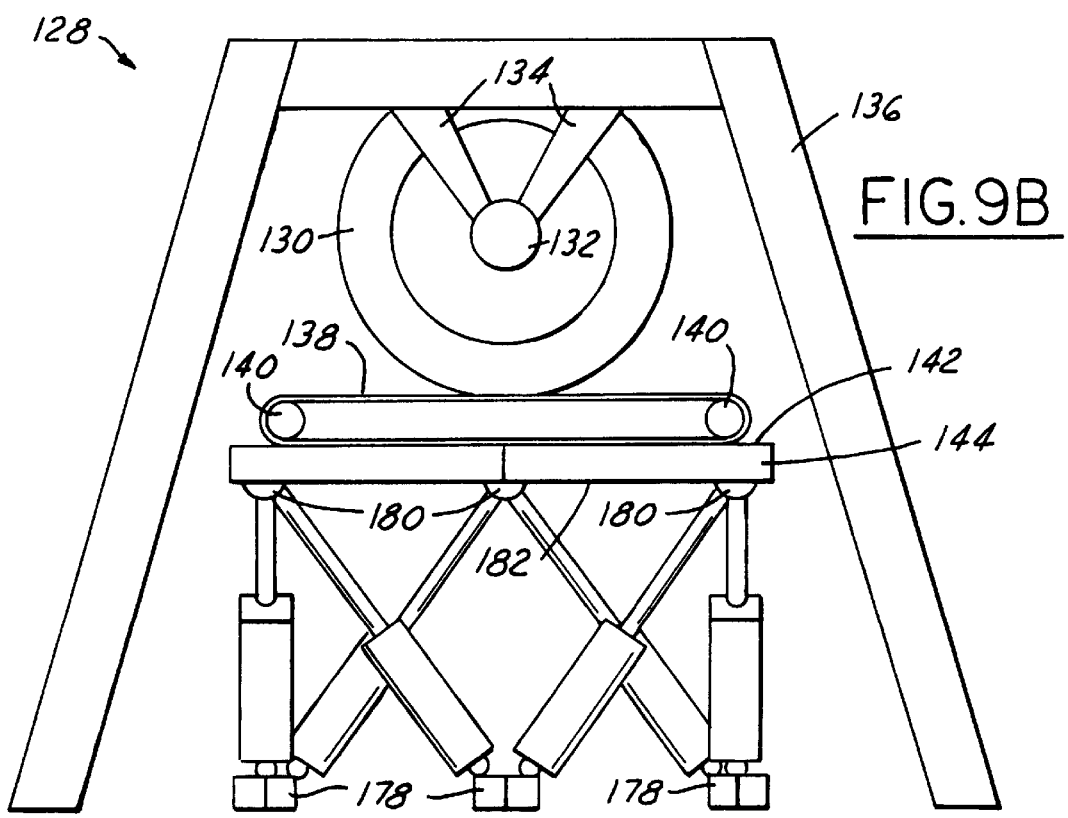
Figure 10A:
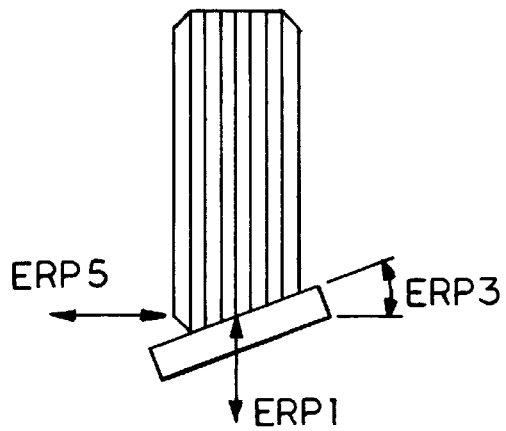
FIGS. 10A, 10B, and 10C, respectively, show front, side, and top views of a tire on a flat tire contact plane of a tire test stand in accordance with the present invention which varies in radial displacement, radial contact angle, lateral contact angle, steer contact angle, lateral displacement, and longitudinal displacement.
Figure 10B:
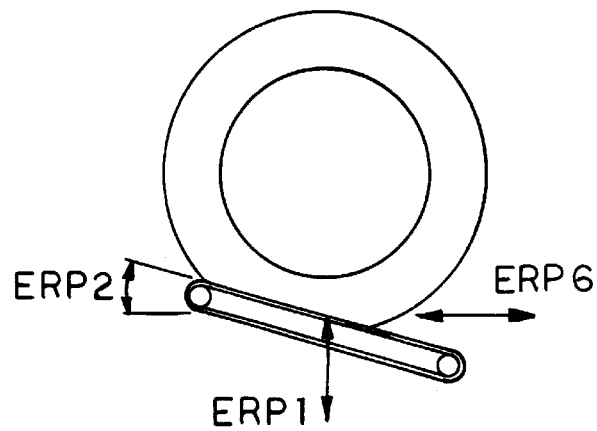
Figure 10C:
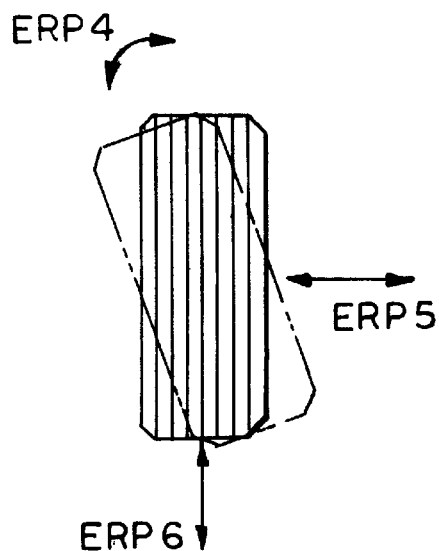

This input/output test data is preferably obtained through use of a tire test stand such as that seen in FIGS. 9A and 9B. An articulated running flat belt platform may be used to provide excitation to the tire and serves as a flat contact plane which varies in vertical deflection at the tire patch center (ERP_1), plane radial contact angle with the tire (ERP_2), plane lateral contact angle with the tire (ERP_3), steer contact angle between the tire and the tire patch (ERP_4), lateral displacement of the tire with the tire patch (ERP_5), and longitudinal displacement of the tire with respect to the tire patch (ERP_6), as seen in FIGS. 10A–10C. The system identification technique thus uses the tire contact plane, or running flat belt, as a coordinate system in which to develop a set of dynamically varying data including radial deflection, radial contact angle, lateral contact angle, steer contact angle, lateral displacement and longitudinal displacement of a tire to be modeled.

Referring again to FIGS. 9A and 9B, a tire test stand 128 for use in developing a tire model for a vehicle to be coupled to the spindle-coupled simulator is shown. A tire 130 is mounted on a spindle 132, and a motor 133 is connected to the spindle to rotate the tire. A set of supports 134 attach the spindle to a tire support structure 136 (FIG. 9B). The tire 130 rests on a roller belt 138 which is attached around a pair of rollers 140 to provide rolling motion. The rollers 140 are fixed on a top side 142 of an articulable table 144 (FIGS. 9A and 9B). Articulation of the table is provided by actuators, which may be hydraulically operated. In one embodiment of the invention, the table 144 is hexagonally shaped and a set of six actuators are connected to a bottom 146 of the table 144, three of the corners 148 of the hexagon having two actuators connected thereto. As seen in FIG. 9B, the actuators may be configured to provide articulation in the six degrees-of-freedom described above. This can be accomplished by diagonally connecting each actuator between a base mount 178 and an actuator connector 180 on a bottom surface 182 of the table 144 at the corners 148 in truss-like fashion. Two adjustable actuators are attached on a bottom of the table 144 at each of three alternate corners defined by intersection of six sides of the table. Those skilled in the art will recognize that this kinematic configuration will allow control of table 144 motion in three translational axes and three rotational axes. A pair of three axis, support force transducers 150 are mounted on spindle supports 152 for collecting spindle dynamics data.

The tire test stand includes measurement transducers for measuring table 144 displacement, table 144 force and acceleration, tire patch to table 144 displacement, and spindle force. Additionally, a displacement transducer, preferably a laser displacement transducer, can be mounted in the table 144 to track the tire patch trajectory in order to develop a loss of contact profile.

Turning again to FIGS. 10A through 10C, a coordinate system is selected to represent tire contact with a road surface so as to make it generic from a testing standpoint while also allowing it to be physically introduced using an experimental test system. To satisfy those requirements, a six degree-of-freedom system is defined in six coordinates: a plane vertical deflection at the tire patch center (ERP_1), a plane radial contact angle with the tire (ERP_2), a plane lateral contact angle with the tire (ERP_3), a steer contact angle between the tire and the tire patch (ERP_4), a lateral displacement of the tire with the tire patch (ERP_5), and a longitudinal displacement of the tire with respect to the tire patch (ERP_6). Loads which affect the structural durability of vehicles can thus be accurately reproduced by achieving the correct force, moment, and acceleration relationships at the spindle which are consistent with the desired road load inputs of a tire. Experimental data for use with the tire model system identification technique is therefore obtained in the form of spindle force, moment, and acceleration, collectively the outputs, as well as the input rolling tire plane deflections.

A radial tire system model can be derived using physical principles and observed experimental behavior, as shown in FIGS. 11 and 12. In FIG. 11, a free body force diagram is shown for a tire. Discussion of the tire model is best understood with reference to FIG. 12, and expanded tire diagram. A spindle force, FSP, acts on the spindle-coupled tire net mass, M, which is derived from physical principles, at the tire spindle, indicated at 130 in FIG. 11. A nonphysical modal tire model matches experimental observation and is represented as modal mass MTM with a first spring 140 mounted between the net mass M and the modal mass MTM, and also having a spring 141 between the modal mass MTM and the table 144. Both springs 140, 141 have a spring stiffness constant K. Likewise, a damper 142 is modeled in parallel with the spring 140 between the tire modal mass MTM and the net mass M, and a damper 143 is in parallel with the spring 141 between the tire modal mass MTM and the table 144. Both dampers 142, 143 have a damping constant of C. Displacement parameters of the spindle, YSP, the modal tire, YTM, and an effective road profile, YERP, are shown in FIG. 8.

A transfer function representing the tire system model can be:

$$M_{tm}s^2 F(s) + 2Cs\, F(s) + 2K\, F(s) = C^2 s^2 Y(s) + 2CKs\, Y(s) + K^2 Y(s)$$

where $$s = (1 - z^{-1})/T$$

This transfer function can be converted to difference equations by using the backward difference relationship for s, as defined above, to convert from a continuous to a discrete form for use with computational methods, as on a computer. As those skilled in the art will recognize, many techniques are available to then estimate the parameters of the resulting linear system model. A preferable method is a least squares algorithm.

Referring now to FIG. 13, a flow diagram for a system identification technique used to identify the dynamic properties of a test tire is shown. A broadband excitation 151 of the tire test stand 152 is required to accurately determine tire dynamic properties. The tire test stand system is excited by a servo hydraulic actuator, which is computer controlled, to identify steady state behavior of the tire. To avoid exceeding static tire deflection, the mean-centered white noise is preferably passed through a quadratic transformation. This allows the input displacement to reach desired levels while simultaneously insuring that tire patch compressive forces are maintained within the static and dynamic limits.

Referring again to FIG. 13, broadband tire input signals 153 and spindle force response signals 154 are collected during the broadband excitation 151 of the tire test stand 152. Both broadband tire input X1 and spindle force response Y1 are then input to the system identification 155. The system identification 155 is a least squares parameter estimation to minimize the model output error against measured output for the model selected. Parameter 156 determinations, such as the spring stiffness constant K and the damping constant C, are subsequently output from the system identification 155 to the tire model 157. The tire model 157 also receives broadband tire input X2 and calculates a spindle force response 158 based upon the tire model. The model spindle force response 158 is then compared to the actual spindle force response Y2 from the test stand to provide tire model correlation 159. Those skilled in the art will recognize that other system identification techniques can be used to obtain invertible tire models and that the radial tire system model just described is given by way of example and not by way of limitation.

An alternative method for modeling a tire for Effective Road Profile (ERP) is by measuring a vertical displacement, a tire patch angle, a vertical spindle force, and a lateral spindle force. Then, an ARX (Auto Regression eXogenous) structure model can be used to obtain a tire model. The ARX model is:

$$\begin{bmatrix} F_x(t) \\ F_y(t) \\ F_z(t) \\ M_x(t) \\ M_y(t) \\ M_z(t) \end{bmatrix} = \begin{bmatrix} H_{11} & \ldots & \ldots & \ldots & \ldots & H_{16} \\ . & . & & & & . \\ . & & . & . & & . \\ . & & & . & & . \\ . & . & & & . & . \\ H_{61} & \ldots & \ldots & \ldots & \ldots & H_{66} \end{bmatrix} \begin{bmatrix} X_1(t) \\ X_2(t) \\ X_3(t) \\ \Phi_1(t) \\ \Phi_2(t) \\ \Phi_3(t) \end{bmatrix}$$

where, $X_i(t)$=Vertical, Lateral, and Longitudinal Displacements, $\phi_i(t)$=Vertical, Lateral, and Longitudinal (Steer) Tire Patch Angles, $F_i(t)$=Vertical, Lateral, and Longitudinal Spindle Force, $M_i(t)$=Steer, Braking, and Camber Moments, $H_{11}, H_{12}, \ldots$, and $H_{66}$ are a continuous transfer function of a form:

$$H = \frac{a_1 S^n + a_2 S^{n-1} + \ldots + 1}{b_1 S^m + b_2 S^{m-1} + \ldots + 1}$$

If spindle response data, such as spindle acceleration and spindle force, are not directly obtainable when driving a vehicle over a test road, other vehicle response data can be recorded and used to derive spindle responses through an intermediate process, as shown in FIG. 16. This intermediate process may be necessary when time and expense constraints prevent direct collection of the spindle dynamics data. For example, instrumentation of a test vehicle to obtain the spindle dynamics data may require time consuming vehicle disassembly and assembly to properly locate the appropriate transducers on or near the vehicle spindles. Beginning at the top left of FIG. 16, a proving grounds facility 161 has a test road over which a vehicle A, indicated at box 162, is driven. The vehicle response data which, for example can be force and acceleration data from a component on the vehicle in the vicinity of the spindle, such as the chassis, is collected, as represented at cylinder 163. Preferably, such data is collected in the vicinity of each of a vehicle's four tires. As previously discussed, such data may be collected using force and acceleration transducers or other data collection devices known in the art.

The vehicle response data is then taken to a test facility or laboratory, as indicated by the dotted line 164, to derive spindle dynamics data, and ultimately an effective road profile. As a first step in that direction, the vehicle response data 163 is used in a feedback control loop, generally indicated at 165 to produce a drivefile A, indicated at cylinder 166, which is used to drive a spindle-coupled road simulator with Vehicle A, which is the vehicle driven over the test road at the proving grounds, coupled thereto. A servo-controller 167, such as a conventional servo-control apparatus is used for control of the road simulator (FIG. 14). System modeling of the vehicle A, the road simulator 168, and the servo-control apparatus 167, collectively comprises a transfer function HA, indicated generally at 169. A "simulated" response, indicated generally at 170, is produced as a result of the road simulator and is compared at summer 171 to the vehicle response 163. The resulting difference between the vehicle response 163 and the simulated response 170 is used as a control signal after being operated on by an inverse transfer function $HA^{-1}$, indicated generally at 172.

Continuing with the second sheet of FIG. 14, the data developed for the drivefile A, at cylinder 166, is then used an input the spindle-coupled simulator and the transfer function 169 in order to collect spindle dynamics data, indicated at cylinder 173, which includes spindle force and spindle acceleration. This spindle dynamics data is then used in conjunction with an inverse of a higher model for vehicle A, indicated at 174, to estimate a generic effective road profile indicated at cylinder 175. As described above, the inverse tire model 174 is based on a tire model of a tire used on vehicle A when driven over the test road. Once a generic effective road profile has been developed, it can be used as described above with reference to FIG. 7. Briefly, a difference between the effective road profile 175 and a "remote" vehicle response 180 is calculated and operated on by an inverse transverse function HBT$^{-1}$, indicated generally at 176, before being written to a drivefile B, indicated generally at cylinder 177. Vehicle B, which has a different configuration than that of vehicle A, is coupled to the spindle-coupled road simulator 178. A servo-controller 179 is used for control of the road simulator 178. System modeling of the vehicle B, the road simulator 178, and the servo-controller, indicated generally at 179, collectively comprise a transfer function HB, indicated at 181. Spindle dynamics data for vehicle B, indicated at cylinder 182, are generated from the road simulator 178 with vehicle B attached thereto. The spindle dynamics data 182 is then used in conjunction with the inverse tire model, indicated at 183, to yield the remote vehicle response 180. Vehicle B can thus be tested, and road forces simulated, without having to drive the vehicle B over a test road.

Figure 15:
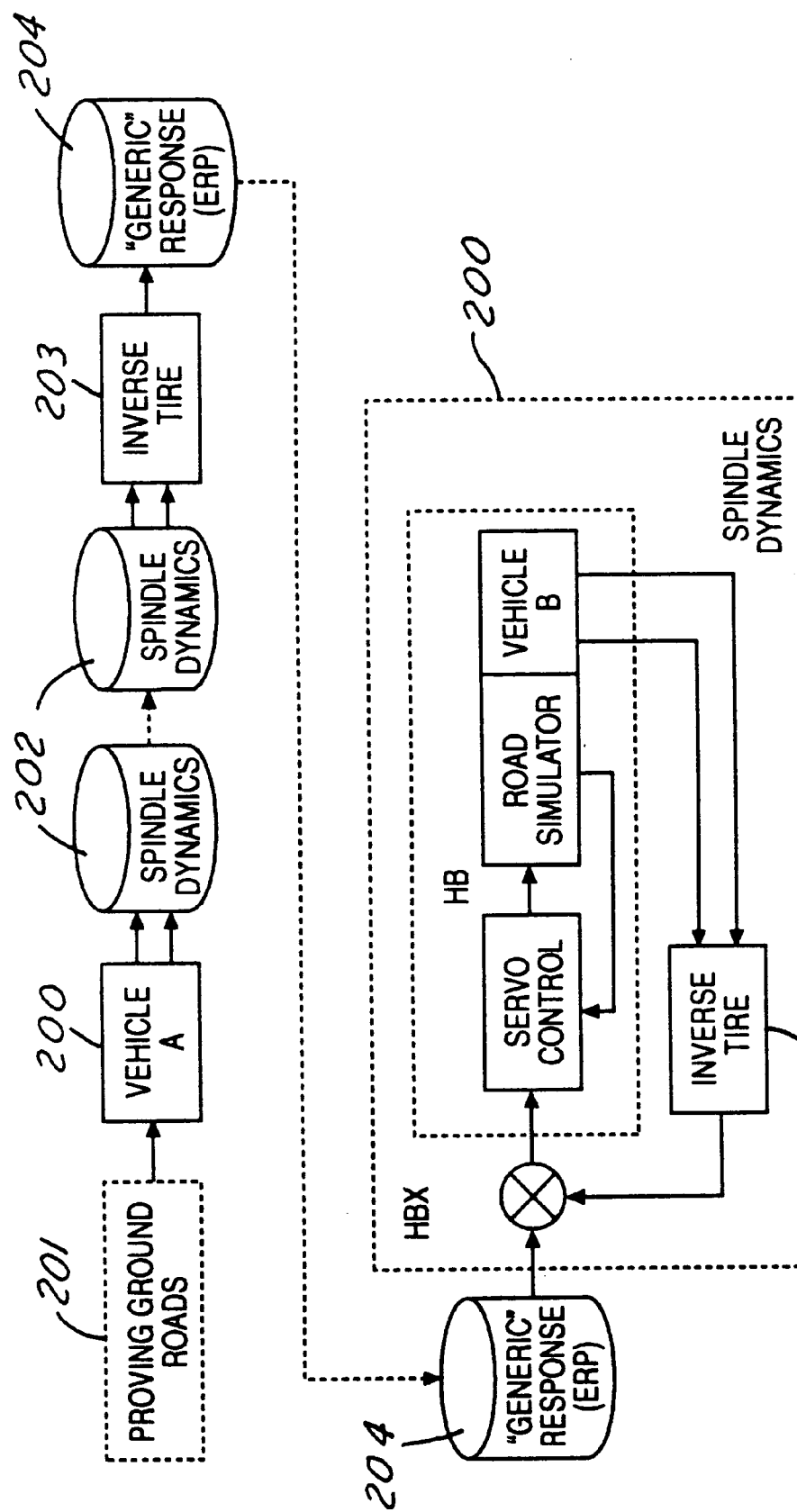
FIG. 15 is a third schematic flow diagram showing a third effective road profile control method for a spindle-coupled simulator.

Turning now to FIG. 15, a second alternative embodiment for the present invention is shown. As with the previously described embodiments, a vehicle A, indicated at 200, is driven over a test road at proving ground facilities, indicated at 201. Spindle dynamics data at 202 is collected and used with an inverse tire model, indicated at 203, to develop a generic effective road profile 204. Unlike the previously discussed embodiments, however, the effective road profile 204 is input directly to a controller of a spindle-coupled simulator, indicated generally at 220. The controller 220 has an inverse tire model 222, for a tire of vehicle B, embedded directly into the controller 220. Such a configuration allows the effective road profile to be used directly as a control signal for the controller 220, thus eliminating certain computational steps required by the previously described embodiments when vehicle B is coupled to the spindle-coupled simulator (see FIGS. 7 and 14).

Although the preferred embodiments of the present invention have been disclosed, various changes and modifications may be made thereto by one skilled in the art without departing from the scope and spirit of the invention as set forth in the appended claims.

We claim:

1. A method for modeling a tire for use with an effective road profile in testing an automotive vehicle on a spindle-coupled road simulator, the method comprising the steps of:

(a) defining a running flat surface road plane in a coordinate reference system having at least four coordinates to represent said effective road profile, said at least four coordinates comprising:
        a vertical deflection, a radial contact angle, a lateral contact angle, and at least one of a steer contact angle, a lateral displacement, and a longitudinal displacement;

(b) mounting a test tire in a tire test stand against an articulated running platform movable in each of said at least four coordinates, with said tire, said contact plane, and said test stand comprising a tire test system;

(c) exciting said platform with said tire in contact therewith over a predetermined excitation range with respect to each of said at least four coordinates;

(d) collecting a set of excitation input data and a set of response output data from said tire test system when excited, said data referenced to said at least four coordinates; and (e) developing a tire model from the input data and the output data.

2. A method according to claim 1 including the steps of:

(f) exciting said tire test system with a predetermined input signal to generate an actual spindle force from said tire;

(g) estimating a simulated spindle force from said tire model based upon said predetermined input signal; and (h) comparing said actual spindle force with said simulated spindle force to verify said tire model with respect to said effective road profile.

3. A method according to claim 1 wherein step (e) further includes the steps of:

matching said input data with said output data;

estimating a spring stiffness constant of said tire system from said input data and said output data based on a linear model of said tire system; and estimating a tire system mass and a tire system damping constant from said input data and said output data using a system identification technique so that a tire model is developed.

4. A method according to claim 1 wherein said excitation range is determined by mounting said tire in said test stand and measuring a static tire deflection necessary to achieve ¼ of the weight of a vehicle, and by moving said tire contact plane into said tire until a predetermined maximum spindle force is achieved at a predetermined tire pressure to determine a maximum deflection amplitude.

5. A method according to claim 1 wherein a transfer function for modeling said tire system in step (e) is $$M_{tm} s^2 F(s) + 2Cs F(s) + 2K F(s) = C^2 s^2 Y(s) + 2CKs Y(s) + K^2 Y(s)$$

where $s = (1-z^{-1})/T$,
    K = spring stiffness constant,
    C = damping constant,
    F(s) = Spindle force,
    Y(s) = Tire deflection, and
    $M_{tm}$ = Tire system mass.

6. A method according to claim 1 wherein the tire system in step (e) is modeled with an auto regression exogenous structure model of the form:

$$\begin{bmatrix} F_x(t) \\ F_y(t) \\ F_z(t) \\ M_x(t) \\ M_y(t) \\ M_z(t) \end{bmatrix} = \begin{bmatrix} H_{11} & \ldots & \ldots & \ldots & \ldots & H_{16} \\ . & . & & & . & . \\ . & & . & . & & . \\ . & & . & . & & . \\ . & . & & & . & . \\ H_{61} & \ldots & \ldots & \ldots & \ldots & H_{66} \end{bmatrix} \begin{bmatrix} X_1(t) \\ X_2(t) \\ X_3(t) \\ \Phi_1(t) \\ \Phi_2(t) \\ \Phi_3(t) \end{bmatrix}$$

where, $X_i(t)$ = Vertical, Lateral, and Longitudinal Displacements,
    $\phi_i(t)$ = Vertical, Lateral, and Longitudinal (Steer) Tire Patch Angles, $F_f(t)$=Vertical, Lateral, and Longitudinal Spindle Force,
$M_i(t)$=Steer, Braking, and Camber Moments, and
$H_{11}, H_{12}, \ldots,$ and $H_{66}$ are continuous transfer functions of a form:

$$H = \frac{a_1 S^n + a_2 S^{n-1} + \ldots + 1}{b_1 S^m + b_2 S^{m-1} + \ldots + 1}.$$

7. A method according to claim 1 wherein said tire test system is excited over said excitation range between a frequency between approximately 0 and 300 hertz of random white noise having an amplitude with a weighting function of the inverse of a square of the frequency.

8. A method according to claim 6 wherein said mean-centered white noise is passed through a quadratic transformation to avoid exceeding static tire deflection.

9. A method for modeling a tire for use with an effective road profile in testing an automotive vehicle on a spindle-coupled road simulator, the method comprising the steps of:

(a) defining a running flat surface road plane in a six coordinate reference system to represent said effective road profile, said six coordinates comprising a vertical deflection, a radial contact angle, a lateral contact angle, a steer contact angle, a lateral displacement, and a longitudinal displacement;

(b) mounting a test tire in a tire test stand against an articulated running platform movable in each of said six coordinates, with said tire, said contact plane, and said test stand comprising a tire test system;

(c) exciting said platform with said tire in contact therewith over a predetermined excitation range with respect to each of said six coordinates;

(d) collecting a set of excitation input data and a set of response output data from said tire test system when excited, said data referenced to said six coordinates; and (e) developing a tire model from the input data and the output data.

10. A method according to claim 8 including the steps of:

(f) exciting said tire test system with a predetermined input signal to generate an actual spindle force from said tire;

(g) estimating a simulated spindle force from said tire model based upon said predetermined input signal; and (h) comparing said actual spindle force with said simulated spindle force to verify said tire model with respect to said effective road profile.

11. A method according to claim 8 wherein step (e) further includes the steps of:

matching said input data with said output data;

estimating a spring stiffness constant of said tire system from said input data and said output data based on a linear model of said tire system; and estimating a tire system mass and a tire system damping constant from said input data and said output data using a system identification technique so that a tire model is developed.

12. A tire test apparatus for developing a tire model for use with an effective road profile in testing an automotive vehicle on a spindle-coupled road simulator, the apparatus comprising:

a support structure;

a spindle attached to said support structure for receiving a tire thereon;

an articulated running platform moveable so as to contact said tire, said platform defining a multiple coordinate reference system to represent said effective road profile, said coordinates comprising at least four of a vertical deflection, a radial contact angle, a lateral contact angle, a steer contact angle, a lateral displacement, and a longitudinal displacement;

at least three adjustment actuators attached to said platform for varying the lateral contact angle, the vertical displacement, the lateral displacement, the longitudinal displacement, the radial contact angle, and the steer contact angle of said platform with respect to said tire;

at least one transducer for measuring contact plane displacement, contact plane angle and tire to contact plane displacement; and at least one transducer for measuring spindle force and spindle moment.

13. A tire test apparatus according to claim 12 wherein a motor is connected to the spindle to rotate the tire.

14. A tire test apparatus according to claim 12 wherein the running platform comprises a table with a pair of rollers on a top thereof, a roller belt connected for rolling motion around the pair of rollers, each of the adjustment actuators connected on a bottom of the table.

15. A tire test apparatus according to claim 12 wherein the at least one transducer is a laser displacement transducer.

16. A tire test apparatus according to claim 12 wherein the table is hexagonally shaped and has two adjustable actuators attached on a bottom thereof at each of three alternate corners defined by intersection of six sides of the table.

* * * * *